United States Patent [19]

Meyerson

[11] Patent Number: 5,298,452

[45] Date of Patent: Mar. 29, 1994

[54] METHOD AND APPARATUS FOR LOW TEMPERATURE, LOW PRESSURE CHEMICAL VAPOR DEPOSITION OF EPITAXIAL SILICON LAYERS

[75] Inventor: Bernard S. Meyerson, Yorktown Heights, N.Y.

[73] Assignee: International Business Machines Corporation, Armonk, N.Y.

[21] Appl. No.: 841,192

[22] Filed: Feb. 21, 1992

Related U.S. Application Data

[63] Continuation of Ser. No. 622,309, Dec. 5, 1990, abandoned, which is a continuation of Ser. No. 342,630, Apr. 19, 1989, abandoned, which is a continuation of Ser. No. 906,854, Sep. 12, 1986, abandoned.

[51] Int. Cl.$^5$ .......................................... H01L 21/205
[52] U.S. Cl. ..................... 437/81; 156/613; 437/95
[58] Field of Search ..................... 156/610, 613, 614

[56] References Cited

U.S. PATENT DOCUMENTS

| | | | |
|---|---|---|---|
| 3,900,597 | 8/1975 | Chruma et al. | 427/82 |
| 4,237,151 | 12/1980 | Strongin et al. | 427/74 |
| 4,401,689 | 8/1983 | Ban | 427/45.1 |
| 4,490,208 | 12/1984 | Tanaka et al. | 156/606 |
| 4,579,609 | 4/1986 | Reif et al. | 148/175 |
| 4,636,401 | 1/1987 | Yamazaki et al. | 427/39 |

OTHER PUBLICATIONS

Meyerson, et al. "Low Temperature Silicon Epitaxy by Hot Wall Ultra High Vacuum/Low Pressure Chemical Vapor Deposition Techniques", Electrochemical Soc. Proc., Pennington, N.J. (1985) pp. 401–402.
Srinivasan, et al. "Current Status of Reduced Temperature Silicon Epitaxy by Chemical Vapor Deposition", Electrochemical Society Softbound Proc., vol. 86-5, pp. 269–285 (1986).
Meyerson et al. "Low Temperature Silicon Epitaxy by Hot Wall Ultra High Vacuum/Low Pressure Chemical Vapor Deposition Techniques", Electrochemical Soc. Softbound Proc., vol. 86-5, pp. 285–296 (1986).
Donahue, et al. "Silicon Epitaxy at 650°–800° Using Low-Pressure Chemical Vapor Deposition Both With and Without Plasma Enhancement", J. Appl. Phys. 57 (8), Apr. 15, 1985, pp. 2757–2765.
Ghandhi, "VLSI Fabrication Principles", John Wiley and Sons, New York, N.Y., 1983, pp. 227–231.
Bloem et al., "Epitaxial Growth of Silicon by CVD . . . .", J. Electrochem. Soc., Aug. 1985, vol. 132, No. 8, pp. 1973–1980.
Roenigk et al., "Analysis of Multicomponent LPCD Process", J. Electrochem. Soc., Feb. 1985, vol. 132, No. 2, pp. 448–454.
Ogirima et al., "Low Pressure Silicon Epitaxy", J. Electrochem. Soc., Jun. 1977, vol. 124, No. 6, pp. 903–908.
Applied Physics Letters, 48(12), p. 797, Mar. 24, 1986.
Journal of the Electrochemical Society, vol. 133, No. 6, p. 1232, Jun. 1986.
G. R. Srinivasan, J. Cryst. Growth, 70, 201 (1984).
G. R. Srinivasan, Solid State Technology, 24, 101(1981).

(List continued on next page.)

Primary Examiner—Olik Chaudhuri
Assistant Examiner—Ourmazd S. Ojan
Attorney, Agent, or Firm—Blaney Harper; Robert M. Trepp

[57] ABSTRACT

A method and apparatus for depositing single crystal, epitaxial films of silicon on a plurality of substrates in a hot wall, isothermal deposition system is described. The deposition temperatures are less than about 800° C., and the operating pressures during deposition are such that non-equilibrium growth kinetics determine the deposition of the silicon films. An isothermal bath gas of silicon is produced allowing uniform deposition of epitaxial silicon films simultaneously on multiple substrates. This is a flow system in which means are provided for establishing an ultrahigh vacuum in the range of about $10^{-9}$ Torr prior to epitaxial deposition. The epitaxial silicon layers can be doped in-situ to provide very abruptly defined regions of either n- or p-type conductivity.

30 Claims, 2 Drawing Sheets

U.S. PATENT DOCUMENTS

G. R. Srinivasan & B. S. Meyerson; Electrochemical Society Softbound Proceeding Series, Pennington, N.J. (1985).

F. Hottier et al., J. Cryst. Growth, 61, 245 (1983).

G. Ghidini & F. W. Smith, J. Electrochemical Society, 109, 1300 (1982) & IBID 131, 2924 (1984).

H. H. Lee, J. Cryst. Growth, 69, pp. 82–90 (1984).

T. Itoh et al., Applied Physics, vol. 39, No. 6, p. 2969, May 1968.

J. M. Blum et al., IBM Technical Disclosure Bulletin, vol. 24, No. 7A, p. 3224 (Dec. 1981).

METHOD AND APPARATUS FOR LOW TEMPERATURE, LOW PRESSURE CHEMICAL VAPOR DEPOSITION OF EPITAXIAL SILICON LAYERS

This application is a continuation of application Ser. No. 07/622,309, filed Dec. 5, 1990, now abandoned, which is a continuation of application Ser. No. 07/342,630, filed Apr. 19, 1989, now abandoned, which in turn is a continuation of application Ser. No. 06/906,854, filed Sep. 12, 1986, now abandoned.

DESCRIPTION

1. Field of the Invention

This invention relates to the deposition of epitaxial silicon layers, and more particularly to a method and apparatus for depositing epitaxial silicon layers on a plurality of substrates at low temperatures and low pressures. Device quality layers are produced which can be doped in-situ.

2. Background Art

It is well recognized that the production of thin epitaxial films of silicon having abrupt and arbitrary dopant profiles is vital in device and circuit fabrication, and particularly in applications such as scaled-down bipolar and CMOS VLSI circuits and processes. In particular, such thin epitaxial layers are useful in order to reduce the dimensions of high performance integrated circuitry. However, the fabrication of such thin epitaxial films is not possible owing to physical phenomena implicit in materials preparatory techniques heretofore known, as described by H. Ogirima et al, J. Electrochemical Soc., 124, 903 (1977). Specifically, the thickness of a device layer deposited by silicon epitaxy has been fixed at values greater than the diffusion length of dopants out of the substrate on which the epitaxial layer is deposited. These dimensions can be on the order of a micron under typical high temperature processing conditions (T≧1000° C.).

In more detail, prior techniques for depositing epitaxial silicon, as for instance the techniques described by G. R. Srinivasan, J. Cryst. Growth 70, 201 (1984) require high processing temperatures. At these high temperatures dopants in the substrate on which the epitaxial layer is deposited can move into the epitaxial layer either by evaporation and redeposition from the gas phase (autodoping), or can move out from the substrate by solid-state diffusion. Still further, dopants intended to be introduced into the epitaxial silicon layer can move in that layer and can diffuse into the substrate. All of the prior art processes for providing epitaxial layers (except for single wafer physical vapor deposition methods such as molecular beam epitaxy) operate at sufficiently high temperatures that dopant redistribution can occur. Because of this, the thickness of the deposited epitaxial layer must be fixed at values greater than the diffusion length of dopants out of the substrate, which in turn means that the ultimate size of a device produced in the epitaxial layer cannot be reduced below this dimension.

Over the past decade, the deposition of homoepitaxial silicon films for technical applications has been performed in essentially the same manner. Typically, the process takes place at temperatures in excess of 1000° C. (or involves a high temperature cycle to clean wafers prior to deposition), using a cold wall/hot susceptor deposition apparatus of the type described by G. R. Srinivasan in Solid-State Technology, 24, 101 (1981). Advances in this technique have reduced autodoping by a lowering of processing pressures, a factor which has allowed continued use of the process.

However, the fabrication of very thin epitaxial layers having abrupt transitions (several atomic widths) in dopant concentration between adjacent single crystal layers cannot be achieved by such prior art techniques. A low temperature process will be required which is sufficient to produce device quality, reproducible epitaxial films having the necessary thinness for device miniaturization. Several classes of such techniques presently being developed are described by G. R. Srinivasan and B. S. Meyerson in the Electrochemical Society Softbound Proceedings Series, Pennington, N.J. (1985).

Various types of low pressure chemical vapor deposition (LPCVD) processing techniques are known in the art, but these are used to produce polycrystalline and amorphous silicon. Typical process pressures used in such techniques are in the range of 200–1000 mTorr. The source gas used in these reactors is typically silane, with a carrier gas such as hydrogen. However, hydrogen carrier gas has a certain contamination level of $H_2O$ (typically in excess of 1 part per million (ppm)) when it reaches the process environment and, for this reason, processing is generally performed in an atmosphere containing partial pressures of $\geq 10^{-4}$ Torr water vapor and oxygen. The effect of water vapor and oxygen must be taken into account in order to provide epitaxial silicon, since the crystallographic perfection of the initial silicon surface upon which epitaxy is to take place is the determining factor in the quality of the resultant epitaxial layer. Systematic investigations have been done in the past to determine the optimum cleaning procedure for a silicon surface prior to its insertion into the deposition apparatus. For example, reference is made to F. Hottier et al, J. Cryst. Growth, 61, 245 (1983) for an analysis of the procedures. Additionally, the quality of the environment into which the substrates are introduced is important. Ghidini and F. W. Smith, J. Electrochemical Soc. 109, 1300 (1982) and ibid 131, 2924 (1984) have conducted basic surface investigations of the $Si/H_2O/SiO_2$ and the $Si/O_2/SiO_2$ equilibrium systems to determine the equilibrium conditions in which both oxygen and water vapor background are such that silicon is effectively etched by these species in order to favor the maintenance of an oxide-free silicon surface.

In prior epitaxial silicon processing conducted at $p \geq 10$ Torr., partial pressures greater than about $10^{-4}$ Torr water vapor and oxygen were present. An oxide free silicon substrate surface is obtained in such a system only if the deposition temperatures remain above 1025° C., in accordance with the data of Ghidini and Smith, described in the referenced articles hereinabove. In these prior systems, source purity requirements are quite stringent in order to be able to operate at process temperatures as low as 1025° C., which is in itself a high temperature.

The present invention is an apparatus and process for achieving device quality epitaxial silicon films without the heretofore mentioned problems, and in particular is a technique for high density batch processing of multiple wafers to provide epitaxial silicon films thereon. In applicant's technique, the temperatures and pressures utilized are much less than those previously utilized and are such that the process is nonequilibrium in nature, i.e., growth kinetics rather than equilibrium thermodynamics govern the deposition process. A hot wall, isothermal CVD apparatus is used in which essentially no homogeneous (gas phase) pyrolysis of the source takes place in the residence time (less than 1 second)/gas temperature regime where the process is operated. Instead, heterogeneous chemistry, where reactions at the surface of the substrate occur, are important.

As will become more apparent later, the present apparatus and process provide the following results and features, not heretofore reported in the literature or elsewhere:

1. In-situ doped CVD silicon epilayers at temperatures $\leq 800°$ C.
2. Use of ultrahigh vacuum (UHV) in combination with a CVD apparatus, thermally driven
3. Use of a hot wall, isothermal system for Si epitaxy at temperatures less than about 800° C., with high throughput
4. Deposition of epitaxial silicon layers at low temperatures where the epitaxial layers are equilivant or superior in electrical characteristics to all epitaxial layers heretofore made
5. The use of deposition temperature as low as approximately 550° C. to provide single crystal Si epitaxial layers having low defect densities, without the use of any external energy (lasers, RF plasmas, . . . )
6. A process and apparatus for batch fabrication of single crystal, epitaxial Si layers on a plurality of substrates wherein an isotropic source gas bath is produced in a thermally driven CVD apparatus.

Accordingly, it is a primary object of the present invention to provide a method and apparatus for epitaxial deposition of silicon layers in a batch process.

It is another object of this invention to provide an apparatus and method for enabling low temperature epitaxy of silicon layers.

It is another object of this invention to provide a CVD apparatus including means for providing ultrahigh vacuum therein, wherein the total system base pressure is less than about $10^{-8}$ Torr.

It is another object of this invention to provide a method and apparatus for low pressure, low temperature fabrication of epitaxial, single crystal silicon layers.

It is another object of this invention to provide a method and apparatus for producing an isotropic gas bath from a silicon source during thermally driven chemical vapor deposition.

It is yet another object of this invention to provide a method and apparatus for gas phase vapor deposition of single crystal silicon in a thermally driven process.

It is another object of this invention to provide a method and apparatus for growing single crystal silicon epitaxially upon a plurality of substrates at temperatures less than 800° C.

It is another object of this invention to provide a method and apparatus for hot wall isothermal epitaxy of silicon layers from a gas source of silicon, said epitaxial layers being grown on multiple substrates at temperatures less than about 800° C.

It is another object of this invention to provide a method and apparatus for chemical vapor deposition of epitaxial silicon layers via a thermally driven process.

It is another of this invention to provide a method and apparatus for uniform epitaxial deposition of single crystal silicon onto multiple substrates via a low temperature, low pressure thermally driven chemical vapor deposition process.

It is another object of this invention to provide an apparatus and method for avoiding gas phase depletion in a hot wall thermally driven CVD process for depositing single crystal epitaxial silicon layers.

It is another object of the present invention to provide an improved thermal technique for epitaxially depositing silicon at temperatures less than about 800° C.

It is another object of this invention to provide a method and apparatus for thermally driven chemical vapor deposition of epitaxial silicon wherein the source gases have reduced purity requirements.

It is another object of this invention to provide a method and apparatus for thermally driven chemical vapor deposition of single crystal silicon films upon multiple substrates wherein these films exhibit significantly reduced impurity contamination.

It is another object of this invention to provide a method and apparatus for thermally driven chemical vapor deposition of uniform single crystal silicon films upon multiple substrates.

It is a further object of this invention to provide a method and apparatus for in-situ doping of silicon epitaxial layers to levels above theoretical limits set by solid solubility during chemical vapor deposition of these layers.

DISCLOSURE OF THE INVENTION

High quality homoepitaxial silicon layers are deposited on multiple substrates through use of ultrahigh vacuum CVD techniques. In contrast with LPCVD techniques, the present technique requires base (ultimate) pressures of less than $10^{-8}$ Torr. and works in temperature and pressure ranges wherein nonequilibrium processes (growth kinetics) dominate the formation of the silicon epitaxial layers. The heterogeneous reactions occurring at the substrate surface are the primary determinants of epitaxial deposition, homogeneous gas phase reactions being, by design, essentially absent in this technique. The apparatus is a hot-wall, multi-wafer CVD system having means for providing base pressures (ultimate vacuum) less than about $10^{-8}$ Torr. This is a flow system in which the source gases are injected at one end and high speed pumps operate at the other end, there being a load lock to eliminate contamination upon loading of the substrates prior to deposition. The system typically operates in a molecular flow regime where the total operating pressure of the Si source gas (such as silane) is less than several hundred mTorr. during deposition. Deposition temperatures are in the range of about 550° C. to 800° C., the preferred range being 550° C. to about 750° C. While the preferred total operating pressure of silane during deposition is in the range $10^{-2}$–$10^{-4}$ Torr, silane pressures up to several hundred militorr may be possible, if very low growth temperatures (500°–650° C.) are used. The technique is more tolerant of the Si source gas pressure as the deposition temperature decreases.

In contrast with prior CVD systems, the present technique utilizes base pressures several orders of magnitude (a factor of $10^3$–$10^6$) below that previously used as well as very low operating pressures and temperatures during deposition, in order to provide a new regime for the epitaxial growth of silicon films. In-situ doping is possible by introducing dopant source gases along with the silicon source gas, or after epitaxial deposition and while vacuum conditions are maintained. Suitable choices for the silicon source gas include silane and higher order silanes, as well as other species. Flow rates are not critical.

These and other objects, features, and advantages will be apparent from the following more particular description of the preferred embodiments.

DETAILED DESCRIPTION OF THE PREFERRED EMBODIMENTS

This invention is an apparatus and process for epitaxially depositing single crystal silicon layers of a desired thickness on a substrate, and more particularly to such a process in which single crystal silicon layers can be epitaxially deposited on a multitude of substrates. Silicon thin films of high crystallographic perfection are deposited on the substrates and can be in-situ doped to any desired level.

Ultra high vacuum (UHV) is used in combination with a CVD system in order to provide initial base pressures less than $10^{-8}$ Torr. After the substrates (silicon) are loaded into the system, deposition proceeds in a manner to prevent the formation of oxide films on the silicon substrates. The total operating pressure of the Si gas source during silicon epitaxy is generally several orders of magnitude less than that heretofore used, creating an isothermal gas bath for deposition onto the substrates and substantially preventing gas phase depletion of the silicon source gas. This allows batch processing to occur. Since the deposition temperature is less than about 800° C., dopant redistribution is avoided, and the problems of autodoping and solid state diffusion described hereinabove are substantially eliminated.

The term "Si gas source" refers to the gas species that contains Si, for example $SiH_4$. It is recognized that the input gas in the CVD reactor can include other non-Si-containing gases, such as $H_2$ and $H_e$. More specifically, the "Si gas source" or "Si-containing source gas" is that gas which decomposes in the reactor to provide Si for epitaxial deposition onto the substrates.

Figure 1:
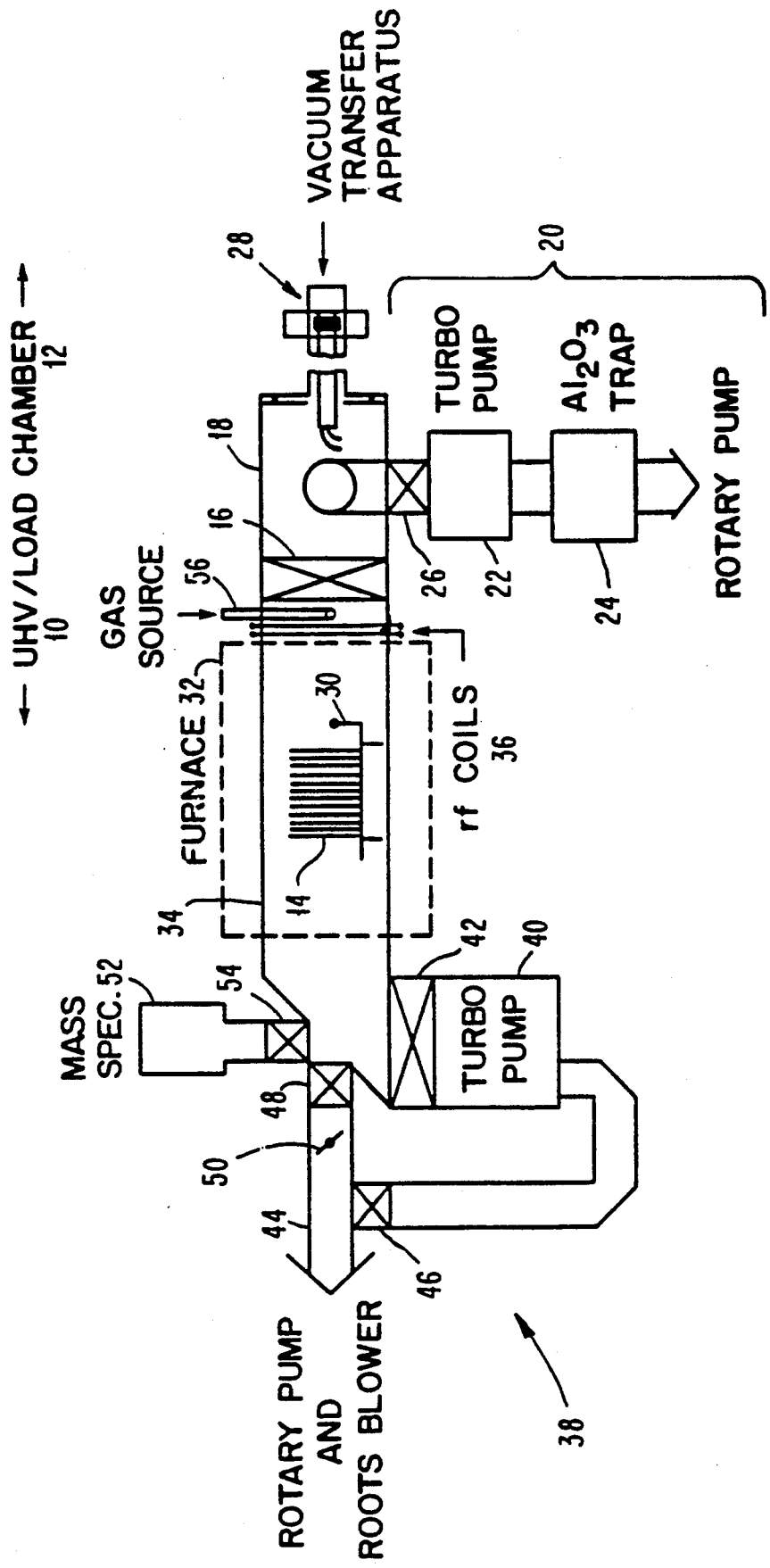
FIG. 1 is a schematic illustration of a UHV/CVD system suitable for the practice of the present invention.

UHV/CVD Apparatus (FIG. 1)

FIG. 1 schematically illustrates an ultrahigh vacuum CVD deposition system capable of depositing epitaxial silicon layers on a plurality of substrates. The apparatus is comprised of an UHV section 10 (deposition chamber, or reactor) and a load chamber section 12 used to load substrates 14 into the UHV section 10. Main valve 16 serves as an isolation valve between UHV section 10 and the load chamber 12.

The function of loading chamber 12 is to provide a low pressure chamber from which the substrates 14 are transferred into the UHV section 10 after the load chamber 12 has been pumped to a pressure below $10^{-6}$ Torr. This ensures that no contaminants are introduced into the UHV section 10 when samples are transferred from load chamber 12 in order to grow epitaxial silicon layers on the substrate 14.

In more detail, loading chamber 12 is comprised of a stainless steel tube 18 having attached thereto means 20 for evacuating chamber 12 to a desired vacuum level. Means 20 is generally a pumping means comprised of a turbo pump 22, an $Al_2O_3$ trap 24, a rotary pump (not shown) and a valve 26. Pumping means 20 is used to evacuate the loading chamber to a low pressure (approximately $10^{-7}$ Torr) prior to transfer of the substrates 14 into the UHV section 10. Also attached to load chamber 12 is a transfer means 28 for transferring the substrates 14 from the load chamber into the UHV section. Transfer means 28 is used to push the quartz boat 30, on which the substrates 14 are located, into UHV section 10.

The pumping means 20 is comprised of a turbo molecular pump 22 of a type that is commercially well known. The trap 24 is also commercially available and is an alumina trap that prevents contamination of the turbo pump 22. Its function is to minimize contamination of turbo pump 22 by hydrocarbons which may be introduced from the rotary pump (not shown). The rotary pump is a mechanical pump which is also well known, as for instance those manufactured by Leybold-Heraeus Co.

Pumping means 20 is used to evacuate the loading chamber prior to movement of the substrate-loaded quartz boat 30 from loading chamber 12 into UHV section 10. This loading operation is done after the desired ultimate vacuum is produced in section 10, and is achieved by the vacuum transfer apparatus 28, which can be any type well known in the art. For example, a magnetic transfer rod, a bellows system, etc. can be used. The function of the transfer apparatus is to move the substrate boat 30 into the UHV section 10 without breaking the vacuums in load chamber 12 and UHV section 10.

The UHV section (also termed a reactor, or deposition chamber) is generally comprised of a hot-wall furnace in which chemical vapor deposition onto the substrates occurs, instrumentation (mass spectrometer) for determining the impurity levels in the furnace, and pumping means for creating an ultimate vacuum at least $10^{-8}$ Torr in the furnace. In more detail, a standard hot wall furnace 32 is comprised of a quartz tube 34, while the rest 18 of the tube is comprised of stainless steel. The RF coils 36 are not required, and are used only for cleaning the quartz tube. Coils 36 produce a hydrogen plasma in order to scrub the interior of quartz tube 34 before its first use. Coils 36 are not required for the practice of this invention, and are not employed except after tube replacement.

Pumping means 38 is used to establish an ultimate vacuum at least $10^{-8}$ Torr in the tube 34, and is comprised of a main process turbo pump 40, and a rotary pump and Roots blower (not shown). Turbo pump 40 is connected to the deposition tube 34 via valve 42, and is also connected to the tube 44 (leading to the rotary pump and Roots blower) by the valve 46. Tube 44 is connected to the deposition tube 34 via valve 48. Pump 40 is also a turbo molecular pump of a type well known in the art, and can be similar to the turbo pump 22 previously described. The rotary pump and Roots blower are high speed mechanical pumps known in the art and provided by several manufacturers, including Leybold-Heraeus Co. A pressure control valve 50 is located in tube 44, and is used to slow the pumping speed only during the initial pumpdown of the UHV section following repairs. Valve 48 and control valve 50 are never opened at any time during actual system use. Adjustment of valve 50 allows one to start the evacuation of tube 34 slowly in order to achieve the proper vacuum therein without drawing contaminants into tube 34 after, for example, guartz tube replacement.

In operation, turbo pump 40 is turned on first, followed by the Roots blower and the rotary pump. Valve 46 is opened most of the time, as is valve 42, to allow pumpdown of the UHV section 10. Valve 48 is primarily closed, and is opened only for repair of the apparatus. For example, if it is desired to change the furnace tube, valve 48 will be opened only to pump down to vacuum after changing the furnace tube. During the normal pumping operation to evacuate tube 34 to a pressure at least as small as $10^{-8}$, valve 48 is closed.

A mass spectrometer 52 is connected to tube 34 via the valve 54, and is used to test the impurity levels within tube 34 in order to insure the continued absence of impurities therein. By opening valve 54 and examining the contents of tube 34, the amount of impurities such as oxygen, carbon, and water vapor can be examined. After this analysis, valve 54 is closed.

The provision of a load chamber means 12 and means 38 to provide an ultrahigh vacuum in the deposition tube of a CVD apparatus has not heretofore been done in the art, and is essential to the deposition of epitaxial silicon layers of high quality onto the substrates 14. For this deposition, the source gases and any dopant gases are injected into tube 34 via the gas source inlet 56.

The major steps in the deposition process are the following:
1. The UHV section is pumped to a pressure which is less than about $10^{-8}$ Torr total pressure.
2. The substrates 14 are transferred from load chamber 12 to the UHV section 10, for epitaxial deposition thereon.
3. The desired operating temperature and pressure are established.
4. The source gas is introduced through inlet 56 in order to create an isothermal gas bath for uniform epitaxial deposition of silicon layers onto the substrates 14.

In the practice of this invention, the operating deposition temperature is less than about 800° C., and the operating total pressure is generally less than about 200 mTorr. Further, the apparatus is operated such that the partial pressures of all contaminants in UHV section 10 are maintained less than $10^{-8}$ Torr at all times, that is, prior to deposition and during deposition onto the substrates 14. No other apparatus or process heretofore known in the art accomplishes this.

While the basic operational steps of the invention have been described in previous paragraphs, the following will provide additional detail of a representative total deposition process. This process is as follows:
1. The pumping apparatus 38 is employed to create a base total pressure less than about $10^{-8}$ Torr. in UHV section 10. During this time, the main isolation valve 16 is closed, isolating reactor section 10 from load chamber 12.
2. The quartz substrate boat 30 is placed into the loading chamber 12, and is baked at approximately 100° C. while the loading chamber 12 is being pumped to a pressure of approximately $10^{-7}$ Torr, using the pumping apparatus 20.
3. Hydrogen gas is injected into section 10 via inlet 56 and the temperature therein is set at about 650° C. The introduction of hydrogen into this section raises the total pressure to about 250 mTorr.
4. The main isolation valve 16 is then opened so that the flow of hydrogen through inlet 56 splits, about half of the flow going into section 10 while the other half goes into load chamber 12. This prevents cross contamination of impurities from load chamber 12 into the deposition section 10.
5. The quartz substrate boat 30 is then transferred from load chamber 12 to deposition chamber 10, and the main isolation valve 16 is closed. The substrates 14 are then baked for about 5 minutes in a hydrogen atmosphere, the baking temperature being whatever temperature is to be the deposition temperature. This will generally be from about 550° C. to about 800° C.
6. The hydrogen flow is stopped and the silicon gas source is activated to introduce a gaseous species containing silicon into the deposition chamber 10. If the epitaxial silicon layers are to be doped in-situ, a dopant-containing gas species can also be introduced via inlet 56.
7. Epitaxial deposition onto all of the substrates then occurs. The pumping system 38 is maintained at all times, the operating pressure within deposition chamber 10 being determined by the amount and flow of the gas species in chamber 10. The thickness of the epitaxial layers so produced depends upon the growth rate and the time of deposition, which are in turn generally controlled by the temperature in the deposition reactor, or to a lesser degree by the reactant pressure.

It had previously been noted that the present apparatus differs from a low pressure CVD apparatus (LPCVD) in that the present apparatus can be used to deposit epitaxial silicon films, while LPCVD systems have always been used to deposit polycrystalline or amorphous silicon, or insulating layers such as silicon nitride. It is recognized that conventional LPCVD systems have been used at low operating temperatures and pressures, such as temperatures less 800° C., and operating pressures down to several hundred mTorr. However, such prior LPCVD systems are not provided with means for producing the base pressures (ultimate vacuum) used by the present applicant. In conventional LPCVD systems, the base pressures are approximately $10^{-3}$ Torr, a factor of $10^6$ above those employed herein, and such that the partial pressures of contaminants in those conventional reactors during deposition will be whatever the base pressure is. Consequently, such prior art system cannot be used to grow single crystal silicon, and certainly not single crystal silicon of adequate purity and low defect concentration so as to be useful in device fabrication.

In contrast with prior LPCVD systems, the present deposition apparatus is operated such that the partial pressures of all contaminants are maintained at pressures less than $10^{-8}$ Torr at all times, that is, prior to deposition and during deposition. These pressure differentials are about 6 orders of magnitude less than those used in conventional LPCVD systems.

In order to maintain a clean interface on which to epitaxially deposit silicon films, the UHV section of the apparatus, on initial systems startup, is pumped and baked until reaching a base pressure in the $10^{-9}$ Torr range. Once at this base pressure, the system is kept under vacuum. Sample introduction is carried out employing, for example, a magnetically coupled load lock. As noted, the UHV section of the apparatus is a hot wall isothermal environment with the substrates being mounted coaxially within the furnace tube. The mass spectrometer is mounted internal to the UHV section of the apparatus and allows rapid in-situ diagnosis of the system. It is employed to insure operation within a stringent vacuum criterion.

As noted previously, a partial pressure of less than $10^{-8}$ Torr $H_2O$ must be maintained in order to achieve an oxide-free surface on the substrate wafers, for deposition at 800° C. A somewhat less stringent requirement of partial pressure is required for oxygen, in order to maintain an oxide free substrate surface. For oxygen, a partial pressure of approximately $10^{-7}$ Torr must be maintained at 800° C. These are minimum design criteria, and in the practice of this invention initial base pressures less than about $10^{-8}$ Torr are used.

After reaching this base pressure, the system is then scrubbed using a hydrogen plasma afterglow produced by the RF coils at the upstream end of the furnace. This step is performed only on system startup after maintenance, and is not critical. It is never performed as part of the wafer cleaning process, as it would cause an extraordinarily high defect density in any deposited film. Once returned to base pressure, the system is kept under vacuum using the turbo molecular pump, Roots blower, and rotary pump system. The substrates are then introduced by employing the magnetically coupled load lock. Samples are allowed to equilibrate under a hydrogen flow prior to deposition, a flow of 600 sccm (standard cubic centimeters of a minimum known mass quantity at a known temperature and pressure), for five minutes being typical. After this, film deposition is initiated by adjusting the growth temperature to be less than 800° C. where the Si gas source operating pressure is reduced to a pressure less than about 200 mTorr. For the case of silicon epitaxy using silane ($SiH_4$) as a silicon source gas, the flow rate of silane can be, for example, $2-10$ sccm. A hydrogen carrier gas can also be introduced at a flow rate of 20 sccm.

In the preceding example, the total silane operating pressure of the system is less than about 200 mTorr, and preferrably in the range $10^{-2}$ $10^{-4}$ Torr. Depending upon the deposition temperature, and the time of deposition, epitaxial silicon layers of varying thickness will be produced. For example, a deposition temperature of 550° C. will provide epitaxial growth at a rate of approximately 5 angstroms/min. As the deposition temperature increases, the growth rate will also increase. For example, growth rates can range from 50–150 angstroms/min. for temperatures of 750°–850° C. Uniformity across any substrate was found to be within $\pm 2\%$ overall and wafer-to-wafer variation was small, typically within a few percent for all wafers mounted in the furnace.

The excellent uniformity which is obtained is directly attributable to the low pressure chemical kinetic limit in which this process operates. At the low silane pressures used during deposition, silane homogeneous pyrolysis rates are limited by the availability of other molecules to impact with for collisional excitation. A consequence is that in this limit chemical kinetic rate constants become linear in total system pressure. Essentially no homogeneous pyrolysis of the silicon source gas takes place in the gas residence time and temperature regime where the process operates. As will be described in more detail later, this unexpected result is in direct contrast to the predicted high rate of decomposition of silane in the gas phase (which is predicted from published literature).

As noted previously, it is difficult to achieve better than one part per million $O_2$ or $H_2O$ impurity levels in a gaseous source at a point of use, and for this reason operating temperatures in prior systems have been typically greater than 1025° C. However, in the present process where very low Si source gas operating pressures (less than about 2 mTorr) are typically used, gaseous sources containing as high as 10 parts per million $H_2O$ can be used without exceeding the limiting partial pressure for stable oxide formation on the substrate surfaces. To emphasize this point, the present system can be compared to conventional systems not using these very low pressures. For example, if a conventional hot wall reactor is operated in a conventional mode where it is pumped from room atmosphere under a $H_2$ purge at 10 Torr base pressure, the residual water vapor partial pressure will be essentially equal to 1 ppm of the system pressure, which is about $10^{-5}$ Torr $H_2O$ after a one hour pump down cycle. This exceeds the UHV operational level of $H_2O$ used in the present invention by more than 4 orders of magnitude, and silicon layers grown in such an environment will remain polycrystalline even above 850° C.

As noted previously, deposition onto multiple wafers can occur with excellent uniformity ($\pm 1-2\%$) of deposition, both within a wafer substrate and from wafer to wafer. This result is remarkable, as it allows batch processing in direct contrast to the results indicated by the published literature. As an example, a model published by H. H. Lee in J. Cryst. Growth 69, 82 (1984) indicates that as much as 98% of the silane in a CVD reactor will be converted by homogeneous (gas phase) reactions to the reactive radical silylene ($SiH_2$) by the following reaction $$SiH_4 \rightarrow SiH_2 + H_2 \qquad (1).$$

Either rapid depletion of silane or its homogeneous pyrolysis to form a highly reactive intermediate such as silylene would lead to severe film inhomogeneity, and would completely preclude batch processing so that uniform deposition onto multiple substrates would not occur. However, neither effect occurs in the present invention where gas phase pyrolysis of the silicon source gas is prevented and batch processing of up to hundreds of wafers can be achieved with excellent uniformity of deposition. This result is also an enormous advance over the previously reported MBE technique where only a line of sight, single wafer deposition is possible. (If very small wafers are placed on a flat holder, it is possible to deposit on up to 4 wafers in sequence in MBE).

In the present invention, no evidence was found of the classical "bullseye effect" wherein the growth rate for epitaxy at the center of a substrate is significantly diminished with respect to the growth rate at the edge of the substrate. In this invention, heterogeneous (surface) modes of silicon source pyrolysis account for film growth, which is due to the extraodinarily low processing pressures employed. At these extremes of pressure, gas phase chemical kinetics cannot be described by simple thermally activated rate constants. Instead, the rate constants must be corrected to allow for the low pressure limits used in the present invention where these rate constants are first order in total system pressure. These corrections are done using the technique developed by Rice, Rampsburger, Kassel, and Marcus in the reference P. J. Robinson and K. A. Holbrook, Unimolecular Reactions, published by Wiley-Interscience, New York, 1972. When the proper correction is applied for the low pressure operating regime of the present invention, the results indicate a reduction in rate constants by more than 2 orders of magnitude from the values described in the literature.

Figure 2:
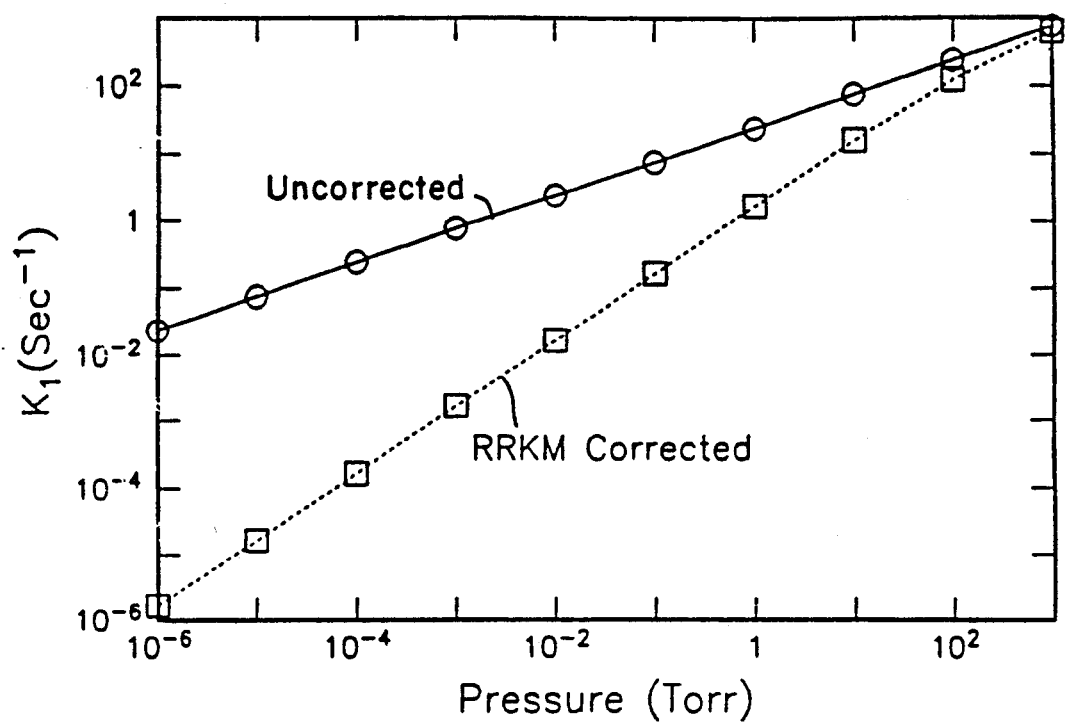
FIG. 2 is a plot of the homogeneous pyrolysis rate constants $K_1$ as a function of operating pressure in a process utilizing silane pyrolysis at 800° C.

FIG. 2 illustrates the difference in results when the proper correction is applied to the thermally activated rate constants that apply to a particular chemical vapor deposition process. In more detail, FIG. 2 plots the chemical kinetic rate constant $K_1$ (sec$^{-1}$) as a function of system pressure for the pyrolysis of silane at 800° C. The top curve indicates the uncorrected data based on the original silane homogeneous pyrolysis data published by J. H. Purnell and R. Walsh in the Proceedings of the Royal Society, 293, 543 (1966). The bottom curve in FIG. 2 contains the corrected data using the aforementioned techniques (RRKM) to allow for the low pressure limit where the rate constants become first order in total system pressure. The proper corrections are made for the pressures utilized in the present invention, the corrections being described by B. S. Meyerson et al in the Proceeding of the Symposium on Low Temperature Processing for VLSI, Oct. 14–18, 1985 (Electrochemical Society, Pennington, N.J. 1985). When the correction is made, the results show a reduction in rate constants by more than 2 orders of magnitude. As a consequence, less than 1 part per thousand conversion of silane to silylene will occur by the homogeneous pathway. This is consistent with laboratory film growth observations and is a fundamentional reason for the success of this UHV/CVD technique.

As the epitaxial process temperature is decreased, the growth of an interfacial oxide prior to deposition as well as the incorporation of contaminants into the growing film are favored. As is known in the art, biased plasma bombardment (using the RF coils to produce the plasma) can be used to enhance low temperature epilayer growth by scouring the initial growth interface. However, high levels of contamination (carbon, oxygen) can occur in the deposited layers. In addition, even at the upper extreme of 800° C., films made by this technique are reported to contain typically $10^{10}$ defects/cm$^2$, a number vastly greater than the technically useful standard of $\leq 500$/cm$^2$. Although enhancement techniques which optimize the initial growth interface do aid in achieving low temperature epilayers, they directly preclude the use of high density wafer packing, and it is still mandatory to adhere to the stringent vacuum criteria described hereinabove (initial pressures less than or equal to $10^{-8}$ Torr), if epilayers of high purity and high crystallographic quality are to be achieved at the deposition temperatures used in the present process.

It is known in the art to utilize in-situ HCl etching of the substrates prior to deposition. However, the surface obtained upon HCl etching at low temperatures quickly becomes faceted, with feature size and number density growing with time. Along with this difficulty, higher chlorosilanes are formed as a consequence of the etching chemistry, rapidly degrading the system vacuum quality. The appearance of facets on the silicon surface during HCl etching have been associated in the literature with the presence of oxygen and water contamination in the gaseous source. Although such problems may be resolved or reduced by the point-of-use purification of the HCl source, the generation of vacuum incompatible byproducts of the etching reaction will not be resolved. Thus, HCl etching can be eliminated, and reliance placed solely on the reduction of oxygen and water background levels in the furnace environment (i.e., the use of very low base pressures) in order to obtain adequately clean silicon substrate surfaces for epitaxial deposition.

As noted previously, the silicon source can be silane, higher order silanes such as disilane ($Si_2H_6$, as well as other gaseous sources of silicon such as $Si_2Cl_6$, $SiCl_4$, $SiH_2Cl_2$, etc.). Whereas prior reactors would not work properly with certain chemistries, the present technique and apparatus are not so limited, and can be used with any gaseous silicon source. In the examples to follow, particularly at the lower end of the temperature range, silane is the preferred source for silicon epitaxy onto a plurality of substrates. The use of chlorine based sources is less desirable, leading to the production of higher chlorisilanes which adversely interferes with the desired pressure level in the reactor, and leads to chlorine contamination.

EXAMPLE 1

Epitaxial silicon layers were produced upon silicon substrates using the apparatus schematically shown in FIG. 1. Prior to its initial use, the entire UHV section of the apparatus was subjected to a thorough bakeout as well as to hydrogen plasma scouring, until an ultimate vacuum in the $10^{-9}$ Torr range was achieved. In-situ mass spectrometry showed hydrogen to be in the greatest abundance, with water vapor and oxygen present at less than $10^{-10}$ Torr partial pressures. No trace of carbon or parent hydrocarbon species was detected.

The substrates were 3.25 inch diameter Si[100], boron doped to $10^{16}$ cm$^{-3}$. These substrates were employed to investigate epitaxial film morphology, while several depositions were performed upon $10^{19}$ cm$^{-3}$ B-doped wafers to investigate autodoping. All wafers were subjected to a 45 second, 1.0% HF dip, and then mounted in a 35-wafer carrier placed coaxially with the tube centerline. The wafer carrier was subjected to a 30 minute bake at 100° C. in the load chamber prior to its transfer into the UHV section. A five minute purge with 600 sccm hydrogen was then performed, followed by the deposition cycle. Typical growth conditions were $550 \leq T \leq 750°$ C. P=1.0–2.0 mTorr, with a gas source of 10 sccm $SiH_4$. Deposition was carried out in 30 minute cycles, forming 3000 angstrom epitaxial layers for T≈750° C. Processing was performed using only the turbopump system to avoid hydrocarbon backstreaming.

Rutherford backscattering (RBS) channeling studies showed spectra obtained from the epitaxial layers produced here to be identical to those observed from a bulk crystal, with the channeled backscattering intensity found to be 4.0% that of a random spectra. Plane view transmission electron microscopy (TEM) was employed to yield quantitative data for crystalline perfection, and showed essentially defect-free ($\leq 10^3$ defects/cm$^2$) material for T$\geq 550°$ C. High contrast optical microscopy revealed a native defect density of the order $10^3$ cm$^{-2}$ in as-prepared 800° C. material. The defects are pinholes, extending to the substrate, in which no material deposition had occurred. The density of these pits in the layers was independent of deposition temperature; however, the use of dust-free sample preparation stations and transfer apparatus resulted in an order of magnitude reduction in their density. The nucleation mechanism of these defects is being investigated but they are obviously related to operation in a standard, non-cleanroom laboratory environment. Secco etching failed to reveal any hidden crystallographic defects in these layers.

A typical secondary ion mass spectrometry (SIMS) result for an 800° C. run showed both carbon and oxygen in the film at the background levels of the SIMS instrument. The extent of dopant outdiffusion from the p+ substrate during a full 120 min, 800° C. deposition cycle is minimal and this is a worse case. The dopant level falls below $10^{15}$ cm$^{-3}$ B in the first 1000 angstroms of the epitaxial layer. Spreading resistance measurements verify this, and active carrier levels of only $10^{14}$ cm$^{-3}$ are found in the undoped epilayers.

EXAMPLE 2

The system of FIG. 1 was subjected to the same predeposition steps described with respect to example 1. Additionally, a series of etching studies was performed on the substrates using in-situ HCl etching of the substrates prior to deposition. Following the etching studies, samples were removed and analyzed for etch rate and resultant surface morphology. After this study of sample pretreatment, a series of UHV/CVD growth experiments were performed.

Wafers, doped $10^{15}$B/cm$^3$, were introduced into the UHV/CVD system in the manner described with respect to example 1. Samples were allowed to equilibrate under a 600 sccm hydrogen flow for 5 minutes, after which film deposition was initiated. Growth conditions were $550 \leq T \leq 775°$ C., using a 10 sccm SiH$_4$ deposition source for 2 hours of deposition and total silane pressure of 1–2 mTorr. Following deposition, wafers were removed via the load lock and subjected to secondary ion mass spectrometry (SIMS), Secco Etching Studies, Rutherford backscattering (RBS), spreading resistance profiling, and transmission electron microscopy (TEM).

The effect of HCl etching has been described previously. It is concluded that this step can be eliminated and that the deposition process can rely solely upon reduction in oxygen and water background levels in the furnace environment in order to obtain an adequately clean silicon substrate surface.

Epitaxial silicon films were obtained over the entire range of temperatures ($550 \leq T \leq 800°$ C.) investigated, as determined by RBS. These tests indicated values typically obtained from bulk single crystal material. All samples in this study tested as being identical. For a more precise measure of crystalline perfection, TEM was then employed. TEM revealed no native defects for films deposited at $550 \leq T \leq 800°$ C.

The chemical purity of the resultant materials was determined by several methods. SIMS was employed to determine carbon and oxygen levels in the films, which were present at the background levels of the SIMS instrument employed, $5 \times 10^{16} - 2 \times 10^{17}$ cm$^{-3}$. No out-diffusion of boron from the substrate was observed, which was not surprising for operation in this temperature regime.

To further investigate for the presence of electrically active impurities with a higher level of sensitivity, spreading resistance measurements were undertaken. Spreading resistance measurements were made on all intrinsic (undoped) samples, with dopant levels (boron) dropping to below detection limits ($10^{14}$ cm$^{-3}$) in the films. At the high end ($T \geq 825°$ C.) of the deposition temperatures employed here, an anomalous change of sample type was observed, with an n-type skin found on several samples. The origin of this is not known, as levels of contamination are in the 0.1 ppm range, making impurity identification difficult. However, as the optimum materials are prepared below this temperature, this appears to be simply a liability of processing at elevated temperatures in a hot wall enironment. Observation of the onset of this impurity problem at high temperatures is reasonable, as the diffusivity of essentially all potential contaminant species through quartz (e.g., the hot furnace tube) rises exponentially with temperature.

Oxide patterned samples were probed for both film thickness and uniformity employing ellipsometry over the oxide covered regions of the wafer. Growth rates ranged from 50-150 angstroms/min for $750°$ C. $\leq T \leq 850°$ C. Uniformity across a wafer was found to be within $\pm 2.0\%$ overall. Along the boat, wafer to wafer variation was small, typically within a few percent among 35 wafers mounted in the boat. Deposition at $550°$ C. results in essentially perfectly uniform Si epitaxial layers.

The excellent uniformity obtained here is directly attributable to the low pressure chemical kinetic limit in which this technique operates. At this extreme of silane pressure, 1.0–2.0 mTorr in this case, silane homogeneous pyrolysis rates are limited by the availability of other molecules to impact with for collisional excitation. A consequence is that in this limit chemical kinetic rate constants become linear in total system pressure.

EXAMPLE 3

This example describes the preparation of in-situ boron doped silicon epilayers, and the results of the first p-n junction devices fabricated using low temperature processing throughout. The apparatus used for this purpose is the apparatus shown schematically in FIG. 1. In preparing the in-situ boron doped silicon layers, a wide range of processing temperatures was employed, T=$550°$–$775°$ C. Gas sources were 90, 1000, or 10,000 ppm. B$_2$H$_6$/H$_2$, and CCD grade silane obtained from Airco Mfg. During film growth, silane flow rates were fixed at 10 sccm., while the dopant source flow was increased at 1 hour intervals, in steps of 2 sccm. each, from 1–13 sccm, during the course of a single run. SIMS was used to determine the result of this experiment, which was carried out at T=$630°$ C. using the 1000 ppm. diborane/hydrogen source. A series of dopant steps are obtained as determined by SIMS, the steps being abrupt to the limit of the SIMS instruments capability to determine this. At the lowest flow rate, an instability in the flow control device led to an observed decrease in dopant incorporation in the first layer. As expected at $630°$ C., no boron diffusion from the $10^{18}$B/cm$^3$ silicon epilayer into the $10^{15}$B/cm$^3$ [100] silicon substrate could be measured.

Boron incorporation efficiency from the gas phase was measured as being roughly constant at 0.3. Crystallographically, layers deposited in this manner were essentially perfect as shown by TEM. As all the doping plateaus were of identical width, the addition of up to 13 sccm. dopant in hydrogen had no effect on the growth rate, which remained fixed at 5.6 angstroms/min. at $630°$ C. (120 angstroms/min at $775°$ C.). Full dopant activation was obtained, as deposited, at all dopant levels, which was determined by mercury probe capacitance voltage profiling and by spreading resistance measurements.

The most striking doping results were obtained in the 1500 angstroms Si epilayer. Employing a 1.0% B$_2$H$_6$/SiH$_4$ deposition source to test the limits of dopant incorporation, a fully activated dopant level in excess of $$1.5 \times 10^{20} B/cm^3$$

was obtained at $550°$ C., which was shown by both TEM and X-ray topography to be defect-free. Due to the hyperabrupt transition between the p+ epilayer and the p− substrate, the differing contrast caused by lattice strain at the high doping levels is for the first time visible by TEM. To verify that this is not an effect due to differential material thinning rates during etching and milling, samples were examined where thickness fringes crossed the interface, and they did so without the distortion that would accompany a thickness step, verifying that this observation is genuine.

Additionally, using lattice imaging, no boron precipitation is observed, although the boron concentration in this material exceeds the growth temperature B solid solubility by in excess of two orders of magnitude. This deposition method is thus highly non-equilibrium, where B is frozen into substitutional Si lattice sites. In addition, it was noted that the incorporation of these high levels of boron actually served to enhance film quality, where heavily doped layers had smoother surface morphologies than undoped layers. Such a "chemical" enhancement effect has been seen previously for other impurities, most notably for germanium in silicon. Although direct evidence has been obtained that germanium enhances the removal of $SiO_x$ from the Si surface, presumably as GeO, which accounts for its enhancement of Si film quality, little data exists as yet for the case of B on Si. There have been several annealing studies which have observed increased crystallization velocities in boron doped amorphous Si layers, which could serve to explain the enhancement that was observed.

These doped Si films are perfectly uniform, where the film thickness, determined by ellipsometry measurements of polysilicon growth over patterned oxide islands varied by less than the uncertainty of the measurement ($\pm 3$ angstroms out of a 4000 angstrom layer). These results are a direct consequence of both the low growth rate as well as the extremely low silane pressure utilized. Gas transport is by molecular flow, source depletion is minimal, and an isotropic gas distribution is expected.

These doping results are in marked contrast to those obtained by molecular beam epitaxy (MBE), where attaining high levels of active boron incorporation at low temperatures is hindered by the lack of convenient boron sources, coupled with a tendency for boron to segregate at high doping levels. It is likely that the present technique achieves these high levels of activation because B surface mobility during growth is suppressed by the presence of an ad-layer of species (silane fragments) which have yet to incorporate into the lattice. In MBE, where such an ad-layer is absent, the mobility of adsorbates is likely higher, although this model remains speculative pending experimental verification.

To evaluate the electronic properties of the material reported above, a series of p-n junctions and MOS capacitor structures were fabricated. To make such a test meaningful, high temperature processing was minimized, employing wet oxidation (T=800° C.) and avoiding any implantation and regrowth steps which might enhance the epi quality and thus diminish the validity of the experiments. Epilayers less than 4000 angstroms thickness were employed, as epitaxial Si quality is most severely tested in thin layers, and it is such thin films that would be employed in the course of fully exploiting low temperature processing.

In-situ B-doped epilayers were fabricated at 550° C. and 775° C. as stated above, with doping levels of approximately $10^{17} B/cm^3$. After a 160 min. wet oxidation at 800° C., windows in the range of 5 to 1,000,000 $\mu m2$ were opened in the resulting 1000 angstroms oxide. 2000 angstroms of polysilicon were then deposited and implanted with a dose of $1\times 10^{16}$ $As/cm^2$ at 30 KeV. This implant energy was chosen to restrict the implant to the polysilicon layer, thus leaving the underlying epilayer undisturbed. A drive-in at 880° C. for 14 minutes defined a p-n junction only 4000 angstroms into the epilayer, and the poly was then patterned to isolate each junction.

For junctions in the range 5-1,000,000 square microns, their characteristics were essentially ideal (n=1.00-1.05). In a 1,000,000 square micron device, an ideality factor of unity was obtained from the 550° C. epilayer, and a leakage current density of $1\times 10^{-17}$ $A/\mu m^2$ at 5.0 volt reverse bias was observed. The leakage currents obtained here are roughly four orders of magnitude below those in previously reported devices in low temperature eqilayers which had been fabricated using far higher temperatures (2.5 hrs. at 950° C.). In addition to the diode characteristics above, oxide breakdown, minority carrier generation lifetime, and dopant profiling by junction capacitance measurements have been performed, and will be reported in detail elsewhere. In summary, a tight distribution of breakdown voltage is seen around 8 Mv/cm, minority generation lifetimes in the range of 100 microseconds are observed in the eiplayer material, and junction capacitance profiling has verified that the intended shallow junction p-n structure was obtained accurately.

This demonstrates for the first time that a low temperature Si epitaxy process can produce devices whose characteristics are equivalent or superior to those fabricated by conventional epitaxy. In-situ boron doping at levels far in excess of equilibrium solid solubilities have been obtained, with full dopant activation without an annealing step. This has served to demonstrate the extraordinarily non-equilibrium nature of this CVD process, and lends strength to the argument that growth kinetics rather than equilibrium thermodynamics govern the chemical vapor deposition process.

In the practice of this invention, an ultrahigh vacuum/chemical vapor deposition technique is described wherein silicon epitaxy provides single crystals on a multitude of substrates (for example, 100–200) located in the apparatus. This allows batch processing which heretofore has not been possible. This advantage occurs because the gas phase pyrolysis of the silicon source gas is essentially eliminated, the growth kinetics being such that deposition primarily occurs due to heterogeneous surface reactions on the substrate. In the further practice of this invention, the extremely low Si source gas operating pressures move the growth kinetics to non-equilibrium conditions where results heretofore unobtainable are now obtained and are reproducible from run-to-run, as well as across individual substrates. Further, the epitaxial films can be doped in-situ to provide either p-type or n-regions therein. While examples have been described using diborane as a p-type dopant source, n-type regions can be created by using, for example, phosphine ($PH_3$).

In the further practice of this invention, it will be realized that, at the low end of processing temperatures, i.e., 550°-650° C., the total Si source gas operating pressures during deposition can be increased somewhat since at these low temperatures gas phase pyrolysis is reduced. Thus, it may be possible to operate in the non-equilibrium region at pressures as high as several hundred (200, or so) mTorr. Even in this situation, however, ultimate total base pressures in the $10^{-9}$ Torr range must be initially achieved. Of course, total operating pressures in excess of this will be obtained if the silicon containing source gas is diluted with another gas, such as an inert gas (for exp., $H_e$). This approach is within the scope of the present invention where the Si-containing source gas total pressure during deposition has as an upper bound several hundred mTorr., especially when the deposition temperature is very low.

Prior to applicant's invention, there has been no reported attempt of silicon epitaxy at these low temperatures in a hot wall system. Attempts at silicon epitaxy using other techniques such as ion beams, plasmas, and molecular beam epitaxy cannot be used to provide batch processing and all of these techniques are cold wall techniques, requiring massive apparatus to process few wafers (1–4). Further, the films so produced often have very high defect levels.

In further distinction over the prior art, the present invention produces single crystal epitaxial silicon layers, which are not to be confused with "epitaxial" silicon films having only small aligned regions corresponding to the substrate throughout the deposited film. These small regions, although being aligned with the substrate, are separated from one another by grain boundaries and dislocations such that a single crystal, as that term is known in the art, is not provided. In reality, these so-called "epitaxial" layers are really well aligned polycrystalline layers having very poor quality and no utility in high performance electronics.

While the invention has been described with respect to particular embodiments thereof, it will be apparent to those of skill in the art that variations can be made therein without departing from the spirit and scope of the present invention. In this regard, the invention is directed to an apparatus and process wherein epitaxial silicon films have been deposited on substrates (such as silicon wafers) in a manner to produce single crystals by growth kinetics which are not described by customary equilibrium models, there being an ultimate base pressure in the $10^{-9}$ Torr range.

Having thus described my invention, what I claim as new and desire to secure by Letters Patent is:

1. A method for forming a silicon containing film having less than approximately 500 defects/cm$^2$ on a substrate, comprising:
    introducing said substrate into a vacuum chamber, said vacuum chamber having a thermal region, said substrate being contained within said thermal region;
    maintaining said thermal region at a temperature of less than approximately 650° Celsius; and
    introducing a silicon source gas into said vacuum chamber, said silicon source gas containing silicon, said silicon source gas interacting with said substrate to form said silicon containing film having less than 500 defects/cm$^2$ on said substrate.

2. A method for forming a silicon containing film having less than approximately 500 defects/cm$^2$ on a substrate, as in claim 1, further comprising:
    developing a base pressure of less than approximately $10^{-8}$ Torr in said vacuum chamber before introducing said substrate into said vacuum chamber;
    maintaining a partial pressure of all contaminants in said vacuum chamber below approximately $10^{-7}$ Torr; and
    maintaining a partial pressure of water vapor in said vacuum chamber below approximately $10^{-8}$ Torr.

3. A method for forming a silicon containing film having less than approximately 500 defects/cm$^2$ on a substrate, as in claim 1, further comprising: maintaining a partial pressure of said silicon source gas in said vacuum chamber below approximately 200 millitorr.

4. A method for forming a silicon containing film having less than approximately 500 defects/cm$^2$ on a substrate, as in claim 3, further comprising:
    introducing at least one dopant gas into said vacuum chamber wherein said dopant gas dopes said silicon containing film.

5. A method for forming a silicon containing film having less than approximately 500 defects/cm$^2$ on a substrate, as in claim 4, wherein:
    said dopant gas is germanium and said silicon containing film is doped with germanium.

6. A method for forming a silicon containing film having less than approximately 500 defects/cm$^2$ on a substrate, as in claim 3, further comprising:
    introducing an n-type dopant gas into said vacuum chamber wherein said n-type dopant dopes a first region of said silicon containing film n-type; and
    introducing a p-type dopant gas into said vacuum chamber wherein said p-type dopant dopes a second region of said silicon containing film p-type.

7. A method for forming a silicon containing film having less than approximately 500 defects/cm$^2$ on a substrate, as in claim 6, further comprising:
    forming a pn junction in said single crystal silicon film.

8. A method for forming a silicon containing film having less than approximately 500 defects/cm$^2$ on a plurality of substrates, comprising:
    introducing said plurality of substrates into a vacuum chamber, said vacuum chamber having a thermal region, said plurality of substrates being contained within said thermal region;
    maintaining said thermal region at a temperature of less than approximately 650° Celsius; and
    introducing a silicon source gas into said vacuum chamber, said silicon source gas containing silicon, said silicon source gas interacting with said plurality of substrates to form said silicon containing film having less than 500 defects/cm$^2$ on said plurality of substrates.

9. A method for forming a silicon containing film having less than approximately 500 defects/cm$^2$ on a plurality of substrates, as in claim 8, wherein:
    said plurality of substrates comprises at least 35 substrates.

10. A method for forming a silicon containing film having less than approximately 500 defects/cm$^2$ on a plurality of substrates, as in claim 9, further comprising:
    developing a base pressure of less than approximately $10^{-8}$ Torr in said vacuum chamber before introducing said substrates into said vacuum chamber;
    maintaining a partial pressure of all contaminants in said vacuum chamber below approximately $10^{-7}$ Torr; and
    maintaining a partial pressure of water vapor in said vacuum chamber below approximately $10^{-8}$ Torr.

11. A method for forming a silicon containing film having less than approximately 500 defects/cm$^2$ on a plurality of substrates, as in claim 9, further comprising:

maintaining a partial pressure of said silicon source gas in said vacuum chamber below approximately 200 millitorr.

12. A method for forming a silicon containing film having less than approximately 500 defects/cm² on a plurality of substrates, as in claim 11, further comprising:

introducing at least one dopant gas into said vacuum chamber wherein said dopant gas dopes said silicon containing film.

13. A method for forming a silicon containing film having less than approximately 500 defects/cm² on a plurality of substrates, as in claim 12, wherein:

said dopant gas is germanium and said silicon containing film is doped with germanium.

14. A method for forming a silicon containing film having less than approximately 500 defects/cm² on a plurality of substrates, as in claim 12, further comprising:

introducing an n-type dopant gas into said vacuum chamber wherein said n-type dopant dopes a first region of said silicon containing film n-type; and introducing a p-type dopant gas into said vacuum chamber wherein said p-type dopant dopes a second region of said silicon containing film p-type.

15. A method for forming a silicon containing film having less than approximately 500 defects/cm² on a plurality of substrates, as in claim 14, further comprising:

forming a pn junction in said silicon containing film.

16. A method for forming a silicon containing film having a thickness of less than approximately 4,000 Angstroms and less than approximately 500 defects/cm² on a substrate, comprising:

introducing said substrate into a vacuum chamber, said vacuum chamber having a thermal region, said substrate being contained within said thermal region;

maintaining said thermal region at a temperature of less than approximately 650° Celsius;

introducing a silicon source gas into said vacuum chamber, said silicon source gas containing silicon, said silicon source gas interacting with said substrate to form said silicon containing film having less than 500 defects/cm² on said substrate; and discontinuing said interaction before said silicon containing film has a thickness of approximately 4,000 Angstroms.

17. A method for forming a silicon containing film having a thickness of less than approximately 4,000 Angstroms and less than approximately 500 defects/cm² on a substrate, as in claim 16, further comprising:

said vacuum chamber having a base pressure of less than approximately $10^{-8}$ Torr, maintaining a partial pressure of all contaminants in said vacuum chamber below approximately $10^{-7}$ Torr; and maintaining a partial pressure of water vapor in said vacuum chamber below approximately $10^{-8}$ Torr.

18. A method for forming a silicon containing film having a thickness of less than approximately 4,000 Angstroms and less than approximately 500 defects/cm² on a substrate, as in claim 16, further comprising:

maintaining a partial pressure of said silicon source gas in said vacuum chamber below approximately 200 millitorr.

19. A method for forming a silicon containing film having a thickness of less than approximately 4,000 Angstroms and less than approximately 500 defects/cm² on a substrate, as in claim 18, further comprising:

introducing at least one dopant gas into said vacuum chamber wherein said dopant gas dopes said silicon containing film.

20. A method for forming a silicon containing film having a thickness of less than approximately 4,000 Angstroms and less than approximately 500 defects/cm² on a substrate, as in claim 19, wherein:

said dopant gas is germanium and said silicon containing film is doped with germanium.

21. A method for forming a silicon containing film having a thickness of less than approximately 4,000 Angstroms and less than approximately 500 defects/cm² on a substrate, as in claim 19, further comprising:

introducing an n-type dopant gas into said vacuum chamber wherein said n-type dopant dopes a first region of said silicon containing film n-type; and introducing a p-type dopant gas into said vacuum chamber wherein said p-type dopant dopes a second region of said silicon containing film p-type.

22. A method for forming a silicon containing film having a thickness of less than approximately 4,000 Angstroms and less than approximately 500 defects/cm² on a substrate, as in claim 21, further comprising:

forming a pn junction in said silicon containing film.

23. A method for forming a silicon containing film having
a thickness of less than approximately 4,000 Angstroms and less than approximately 500 defects/cm² on a plurality of substrates comprising:

introducing said plurality of substrates into a vacuum chamber, said vacuum chamber having a thermal region, said plurality of substrates being contained within said thermal region;

maintaining said thermal region at a temperature of less than approximately 650° Celsius;

introducing a silicon source gas into said vacuum chamber, said silicon source gas containing silicon, said silicon source gas interacting with said plurality of substrates to form said silicon containing film having less than 500 defects/cm² on said plurality of substrates; and discontinuing said interaction before said silicon containing film has a thickness of approximately 4,000 Angstroms.

24. A method for forming a silicon containing film having a thickness of less than approximately 4,000 Angstroms and less than approximately 500 defects/cm² on a plurality of substrates, as in claim 23, wherein:

said plurality of substrates comprises at least 35 substrates.

25. A method for forming a silicon containing film having a thickness of less than approximately 4,000 Angstroms and less than approximately 500 defects/cm² on a plurality of substrates as in claim 24, further comprising:

developing a base pressure of less than approximately $10^{-8}$ Torr in said vacuum chamber before introducing said substrates into said vacuum chamber;

maintaining a partial pressure of all contaminants in said vacuum chamber below approximately $10^{-7}$ Torr; and maintaining a partial pressure of water vapor in said vacuum chamber below approximately $10^{-8}$ Torr.

26. A method for forming a silicon containing film having a thickness of less than approximately 4,000 Angstroms and less than approximately 500 defects/cm$^2$ on a plurality of substrates as in claim 24, further comprising:

maintaining a partial pressure of said silicon source gas in said vacuum chamber below approximately 200 millitorr.

27. A method for forming a silicon containing film having a thickness of less than approximately 4,000 Angstroms and less than approximately 500 defects/cm$^2$ on a plurality of substrates as in claim 26, further comprising:

introducing at least one dopant gas into said vacuum chamber wherein said dopant gas dopes said silicon containing film.

28. A method for forming a silicon containing film having a thickness of less than approximately 4,000 Angstroms and less than approximately 500 defects/cm$^2$ on a plurality of substrates, as in claim 27, wherein:

said dopant gas is germanium and said silicon containing film is doped with germanium.

29. A method for forming a silicon containing film having a thickness of less than approximately 4,000 Angstroms and less than approximately 500 defects/cm$^2$ on a plurality of substrates, as in claim 27, further comprising:

introducing an n-type dopant gas into said vacuum chamber wherein said n-type dopant dopes a first region of said silicon containing film n-type; and introducing a p-type dopant gas into said vacuum chamber wherein said p-type dopant dopes a second region of said silicon containing film p-type.

30. A method for forming a silicon containing film having a thickness of less than approximately 4,000 Angstroms and less than approximately 500 defects/cm$^2$ on a plurality of substrates, as in claim 29, further comprising:

forming a pn junction in said silicon containing film.

* * * * *